United States Patent
Ishii et al.

(10) Patent No.: US 9,216,655 B2
(45) Date of Patent: Dec. 22, 2015

(54) VEHICLE AND POWER SUPPLY SYSTEM

(75) Inventors: Daisuke Ishii, Toyota (JP); Tomoyuki Mizuno, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 13/879,637

(22) PCT Filed: Nov. 17, 2011

(86) PCT No.: PCT/JP2011/076522
§ 371 (c)(1),
(2), (4) Date: Apr. 16, 2013

(87) PCT Pub. No.: WO2013/073034
PCT Pub. Date: May 23, 2013

(65) Prior Publication Data
US 2014/0217972 A1 Aug. 7, 2014

(51) Int. Cl.
*H02J 7/00* (2006.01)
*B60L 11/18* (2006.01)
*B60L 3/00* (2006.01)
(Continued)

(52) U.S. Cl.
CPC ............... *B60L 11/1816* (2013.01); *B60L 3/00* (2013.01); *B60L 3/0069* (2013.01); *B60L 3/12* (2013.01); *B60L 11/123* (2013.01); *B60L 11/14* (2013.01); *B60L 11/18* (2013.01); *B60L 11/1842* (2013.01); *B60L 11/1861* (2013.01); *H02J 7/0054* (2013.01); *B60L 2230/12* (2013.01); *B60L 2230/30* (2013.01); *G01R 31/3278* (2013.01); *H01H 2047/003* (2013.01)

(58) Field of Classification Search
CPC .................................................. B60L 11/1816

USPC .......................................................... 320/109
See application file for complete search history.

(56) References Cited

U.S. PATENT DOCUMENTS 7,095,191 B2 * 8/2006 Sakurai ........................ 318/139
7,834,635 B2 * 11/2010 Oosawa et al. ............... 324/429
(Continued)

FOREIGN PATENT DOCUMENTS

EP  2 309 617 A1  4/2011
JP  A-2005-56728  3/2005
(Continued)

OTHER PUBLICATIONS

Feb. 11, 2015 Extended European Search Report issued in Application No. 11874123.0.

*Primary Examiner* — Drew A Dunn
*Assistant Examiner* — Steve T. Chung
(74) *Attorney, Agent, or Firm* — Oliff PLC

(57) ABSTRACT

A vehicle includes a charging unit receiving electric power supplied from an external power supply through a power feeding cable connected to an inlet for charging a power storage device; a discharging unit for supplying electric power from the power storage device to the power feeding cable through the inlet; a discharge relay; and a charge relay. When ending a discharging operation, an ECU outputs an opening instruction to the discharge relay and determines based on the state of a power line during output of the opening instruction whether the discharge relay is welded or not. When starting the discharging operation, the ECU outputs a closing instruction to the discharge relay and does not determine during output of the closing instruction whether the discharge relay is welded or not.

11 Claims, 10 Drawing Sheets

(51) Int. Cl.
    *B60L 3/12*                (2006.01)
    *B60L 11/12*            (2006.01)
    *B60L 11/14*            (2006.01)
    *G01R 31/327*          (2006.01)
    *H01H 47/00*           (2006.01)

(56) References Cited

U.S. PATENT DOCUMENTS

| | | | |
|---|---|---|---|
| 8,069,831 | B2 * | 12/2011 | Matsubara ................ 123/179.2 |
| 2006/0071618 | A1 | 4/2006 | Yudahira et al. |
| 2009/0302801 | A1 * | 12/2009 | Katsunaga .................... 320/109 |
| 2010/0194354 | A1 * | 8/2010 | Gotou et al. .................. 320/163 |
| 2010/0295506 | A1 * | 11/2010 | Ichikawa ..................... 320/108 |
| 2011/0121780 | A1 * | 5/2011 | Fukuo et al. ................. 320/109 |
| 2011/0148191 | A1 | 6/2011 | Nakamura et al. |
| 2011/0279082 | A1 * | 11/2011 | Hagenmaier et al. ......... 320/109 |
| 2012/0007553 | A1 * | 1/2012 | Ichikawa et al. ............. 320/109 |
| 2012/0091954 | A1 * | 4/2012 | Matsuki ....................... 320/109 |
| 2012/0098490 | A1 * | 4/2012 | Masuda ........................ 320/109 |
| 2012/0319648 | A1 * | 12/2012 | Ohtomo ....................... 320/109 |
| 2013/0106350 | A1 * | 5/2013 | Ono et al. .................... 320/109 |
| 2013/0162208 | A1 * | 6/2013 | Ohnuki ........................ 320/109 |
| 2015/0015211 | A1 * | 1/2015 | Choi ............................ 320/137 |

FOREIGN PATENT DOCUMENTS

| | | |
|---|---|---|
| JP | A-2006-121844 | 5/2006 |
| JP | A-2006-129691 | 5/2006 |
| JP | A-2009-296844 | 12/2009 |
| JP | A-2010-238576 | 10/2010 |
| JP | A-2011-15567 | 1/2011 |
| JP | A-2011-135654 | 7/2011 |
| JP | A-2011-205755 | 10/2011 |
| WO | 2010/113904 A1 | 10/2010 |

* cited by examiner

VEHICLE AND POWER SUPPLY SYSTEM

TECHNICAL FIELD

The present invention relates to a vehicle and a power supply system, and more particularly to a technique for supplying electric power from a vehicle to a load external to the vehicle.

BACKGROUND ART

In a vehicle such as an electric vehicle, a hybrid vehicle, a fuel-cell electric vehicle and the like that is configured to be capable of generating a vehicle driving force by an electric motor, a power storage device storing electric power for driving the electric motor is mounted. In such a vehicle, electric power is supplied from the power storage device to the electric motor at the time of start-up, acceleration and the like of the vehicle for generating a vehicle driving force while electric power generated by regenerative braking of the electric motor during running on a downhill, during deceleration and the like is supplied to the power storage device.

It is proposed for the above-described vehicle to provide a configuration allowing electrical connection to a power supply external to the vehicle such as a commercial power supply (which will be hereinafter simply referred to as an "external power supply") so that the power storage device can be charged (which will be hereinafter simply referred to as "external charging"). For example, the so-called plug-in hybrid vehicle is known that has a power storage device chargeable from a power supply of an ordinary household by connecting a power supply outlet provided at the house and a charging inlet provided at the vehicle by means of a charging cable. This allows an increase in fuel consumption efficiency of a hybrid vehicle.

For example, Japanese Patent Laying-Open No. 2011-15567 (PTL 1) discloses an electrically powered vehicle including a power storage device, an inverter driving a rotating electric machine for vehicle running with the electric power of the power storage device, and a charging device for charging the power storage device with the electric power of an external power supply. In this PTL 1, the charging device includes a relay for switching a power feeding path extending from the external power supply to the power storage device so as not to cut off the path between the power storage device and the inverter. The charging device further includes a control device for determining whether the relay is welded or not while controlling the relay to be kept in an opened state during a switching operation of the inverter.

CITATION LIST

Patent Literature

PTL 1: Japanese Patent Laying-Open No. 2011-15567
PTL 2: Japanese Patent Laying-Open No. 2010-238576
PTL 3: Japanese Patent Laying-Open No. 2006-121844

SUMMARY OF INVENTION

Technical Problem

For an externally chargeable vehicle as described above, there has been developed a concept of supplying electric power from a vehicle, which is regarded as a power supply source, to a load external to the vehicle, as seen in the smart grid and the like.

As a configuration for supplying electric power to a load external to the vehicle, the vehicle further includes a discharging device for supplying electric power from the power storage device to the load external to the vehicle. This discharging device is provided with a relay for switching a power feeding path extending from the power storage device to outside the vehicle. In the above-described configuration, when switching between the charging operation of charging the power storage device with the electric power from the external power supply and the discharging operation of supplying the electric power from the power storage device to an external load, the relay within each of the charging device and the discharging device is controlled to be turned on/off (closed/opened).

In the above-described vehicle, in order to prevent the electric power from the power storage device from flowing into the charging device during the discharging operation and to prevent the electric power from the external power supply from flowing into the discharging device during the charging operation, it is necessary to determine whether a relay is welded or not in each of the charging device and the discharging device, where the meaning of welding would be understood by a skilled artisan as joining a contact of a relay by causing adhesion.

For example, in addition to performing determination about welding of the relay within the discharging device at the start of the discharging operation, determination about welding of the relay within the discharging device is performed also when starting the charging operation, which allows detection also of welding occurring after starting the discharging operation, so that the reliability of the relay can be improved.

On the other hand, however, since the frequency of performing determination about welding of the relay is increased to thereby cause an increase in the number of operations of the relay, the durability of the relay may be decreased. Furthermore, in order to ensure the frequency of determination about welding, it is necessary to mount a relay having higher durability in a vehicle, which may lead to an increase in cost.

Thus, the present invention has been made to solve the above-described problems. An object of the present invention is to provide a vehicle configured to be capable of switching between a charging operation of charging a vehicle-mounted power storage device with electric power from an external power supply and a discharging operation of supplying electric power from the power storage device to an external load so as to be executable, and a power supply system including the vehicle, in which determination about welding of a switching device is performed while suppressing a decrease in durability of the switching device for switching between the charging operation and the discharging operation.

Solution to Problem

According to an aspect of the present invention, a vehicle includes a rechargeable power storage device; a power line for transmitting electric power between the power storage device and outside the vehicle; a switching device interposed in the power line and configured to allow electrical connection and disconnection between the power storage device and outside the vehicle; and a control device determining when ending transmission of electric power between the power storage device and outside the vehicle whether the switching device is welded or not, and not determining when starting transmission of electric power between the power storage device and outside the vehicle whether the switching device is welded or not.

Preferably, when ending transmission of electric power between the power storage device and outside the vehicle, the control device outputs an opening instruction to the switching device, and determines whether the switching device is welded or not based on a state of the power line during output of the opening instruction.

Preferably, the vehicle is configured to be capable of switching between a charging operation of charging the power storage device with electric power from an external power supply and a discharging operation of supplying electric power from the power storage device to an external load so as to be executable. The control device determines whether the switching device is welded or not based on the state of the power line during output of the opening instruction for ending the charging operation or the discharging operation.

Preferably, the vehicle further includes a connection unit for electrically connecting the vehicle and outside the vehicle; a charging unit receiving electric power supplied from the external power supply through a cable connected to the connection unit for charging the power storage device; and a discharging unit for supplying electric power from the power storage device to the cable through the connection unit. The switching device includes a first switching unit interposed in a first power line connecting the discharging unit and the connection unit; and a second switching unit interposed in a second power line connecting the power storage device and the charging unit. When ending the discharging operation, the control device outputs the opening instruction to the first switching unit, and determines whether the first switching unit is welded or not based on a state of the first power line during output of the opening instruction.

Preferably, when ending the charging operation, the control device outputs the opening instruction to the second switching unit, and determines whether the second switching unit is welded or not based on a state of the second power line during output of the opening instruction.

According to another aspect of the present invention, a power supply system includes a vehicle and a power feeding device for transmitting electric power between the vehicle and outside the vehicle. The power feeding device is configured to allow transmission of electric power from an external power supply to the vehicle through a cable connected to a connection unit provided in the vehicle, and allow transmission of electric power from the vehicle to an external load through the cable. The vehicle includes a rechargeable power storage device; a power line for transmitting electric power between the power storage device and outside the vehicle; a switching device interposed in the power line and configured to allow electrical connection and disconnection between the power storage device and outside the vehicle; and a control device determining when ending transmission of electric power between the power storage device and outside the vehicle whether the switching device is welded or not, and not determining when starting transmission of electric power between the power storage device and outside the vehicle whether the switching device is welded or not.

Preferably, the vehicle further includes a charging unit receiving electric power supplied from the external power supply through the cable for charging the power storage device; and a discharging unit for supplying electric power from the power storage device to the cable through the connection unit. The switching device includes a first switching unit interposed in a first power line connecting the discharging unit and the connection unit; and a second switching unit interposed in a second power line connecting the power storage device and the charging unit. When ending a discharging operation of supplying electric power from the power storage device to the external load, the control device outputs an opening instruction to the first switching unit, and determines whether the first switching unit is welded or not based on a state of the first power line during output of the opening instruction. When starting the discharging operation, the control unit outputs a closing instruction to the first switching unit, and does not determine whether the first switching unit is welded or not.

Preferably, when ending a charging operation of charging the power storage device with electric power from the external power supply, the control device outputs the opening instruction to the second switching unit, and determines whether the second switching unit is welded or not based on a state of the second power line during output of the opening instruction. When starting the charging operation, the control device outputs the closing instruction to the second switching unit, and does not determine whether the second switching unit is welded or not.

Preferably, the power feeding device is configured to allow power line communication with the vehicle using the cable. The power feeding device determines whether the first switching unit is welded or not based on a state of the cable during output of the opening instruction to the first switching unit, and transmits a determination result to the control device.

According to another aspect of the present invention, a control method of a vehicle configured to allow transmission of electric power between a rechargeable power storage device and outside the vehicle is provided. The method includes the steps of: when ending transmission of electric power between the power storage device and outside the vehicle, outputting an opening instruction to a switching device interposed in a power line for transmitting electric power between the power storage device and outside the vehicle, and determining whether the switching device is welded or not based on a state of the power line during output of the opening instruction; and when starting transmission of electric power between the power storage device and outside the vehicle, outputting a closing instruction to the switching device, and not determining during output of the closing instruction whether the switching device is welded or not.

Advantageous Effects of Invention

According to the present invention, in a vehicle configured to be capable of switching between a charging operation of charging a vehicle-mounted power storage device with electric power from an external power supply and a discharging operation of supplying electric power from the power storage device to an external load so as to be executable, and a power supply system including the vehicle, determination about welding of the switching device can be performed while suppressing a decrease in durability of the switching device for switching between the charging operation and the discharging operation.

DESCRIPTION OF EMBODIMENTS

Figure 1:
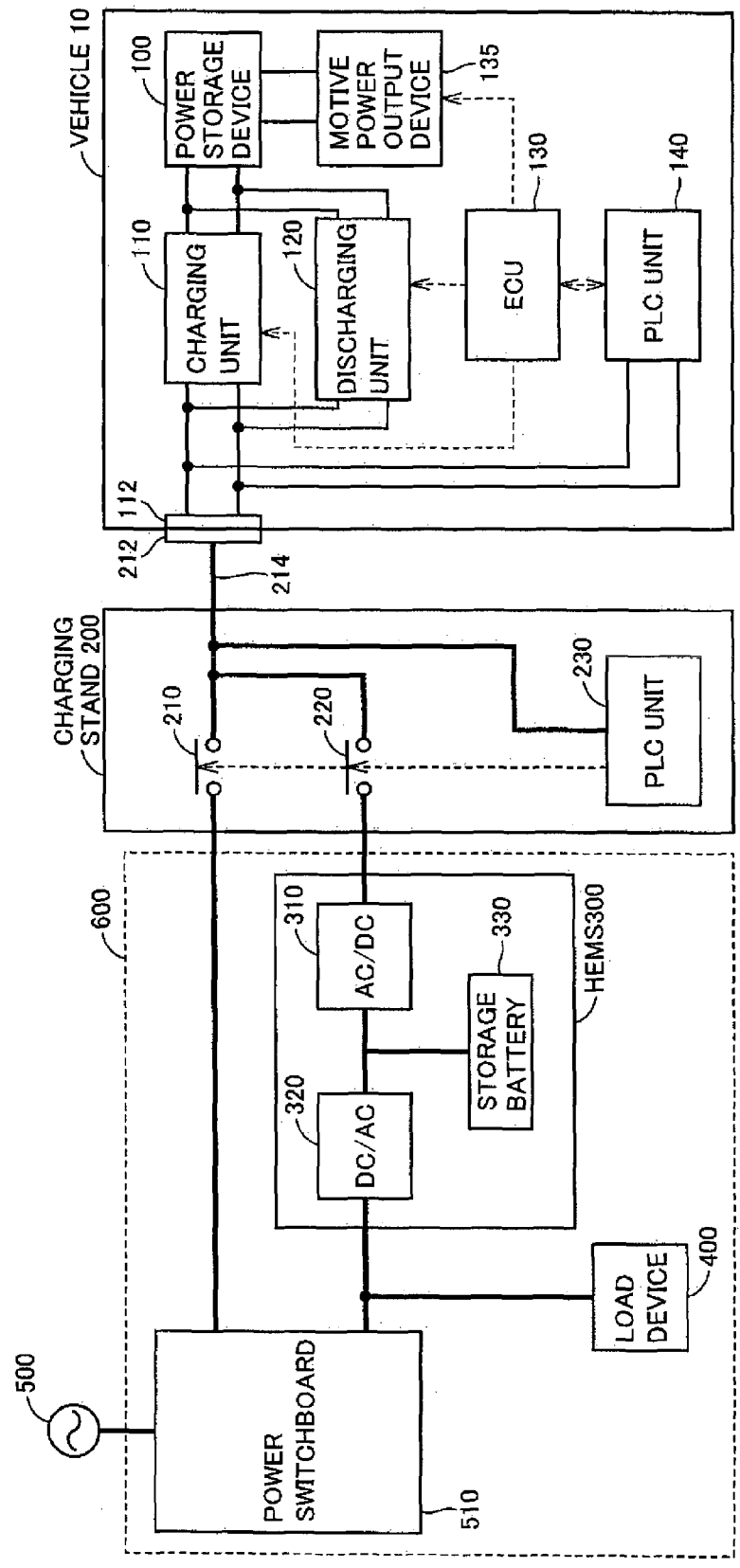
FIG. 1 is a schematic configuration diagram of a power supply system according to an embodiment of the present invention.

Embodiments of the present invention will be hereinafter described in detail with reference to the accompanying drawings, in which the same or corresponding components are designated by the same reference characters.

FIG. 1 is a schematic configuration diagram of a power supply system according to an embodiment of the present invention.

Referring to FIG. 1, a power supply system includes a vehicle 10, a charging stand 200, a HEMS (Home Energy Management System) 300, a load device 400, a power supply 500 external to vehicle 10 (which will be hereinafter also referred to as an "external power supply"), and a power switchboard 510.

Vehicle 10 according to the embodiment of the present invention is the so-called plug-in type electrically powered vehicle including a vehicle-mounted power storage device that can be charged by external power supply 500. The configuration of the electrically powered vehicle is not particularly limited as long as the electrically powered vehicle can run with electric power from the vehicle-mounted power storage device. Examples of vehicle 10 may include a hybrid vehicle, an electric vehicle, a fuel cell vehicle, and the like.

Vehicle 10 includes a power storage device 100, a motive power output device 135, an ECU (Electronic Control Unit) 130 for controlling the entire operation of vehicle 10, and a PLC (Power Line Control) unit 140.

Power storage device 100 is a rechargeable electric power storage element, and representatively applied as a secondary battery such as a lithium-ion battery and a nickel-metal hydride battery. Alternatively, power storage device 100 may be formed of an electric power storage element other than a battery, such as an electric double layer capacitor. FIG. 1 shows a system configuration related to charge/discharge control of power storage device 100 in vehicle 10. Power storage device 100 is provided with a battery sensor (not shown) for detecting a voltage and a current of power storage device 100.

Motive power output device 135 generates driving power for vehicle 10 using the electric power stored in power storage device 100. Specifically, motive power output device 135 generates driving power for vehicle 10 based on the driving instruction from ECU 130, and outputs the generated driving power to driving wheels (not shown) of vehicle 10. In addition, the driving instruction is a control instruction generated based on the vehicle driving power or the vehicle braking force requested during running of vehicle 10. Specifically, ECU 130 calculates the vehicle driving power and the vehicle braking force required by the entire vehicle 10 in accordance with the vehicle state of vehicle 10 and a driver's operation (the stepping amount of an accelerator pedal, the position of a shift lever, the stepping amount of a brake pedal, and the like). Then, ECU 130 generates a driving instruction for motive power output device 135 so as to implement the requested vehicle driving power or vehicle braking force.

Furthermore, when receiving a power generation instruction from ECU 130, motive power output device 135 generates electric power to be supplied to load device 400 external to the vehicle, and outputs the generated electric power to discharging unit 120. It is to be noted that the power generation instruction is a control instruction for instructing generation of electric power that is to be supplied to load device 400 in the discharging operation described later.

Figure 2:
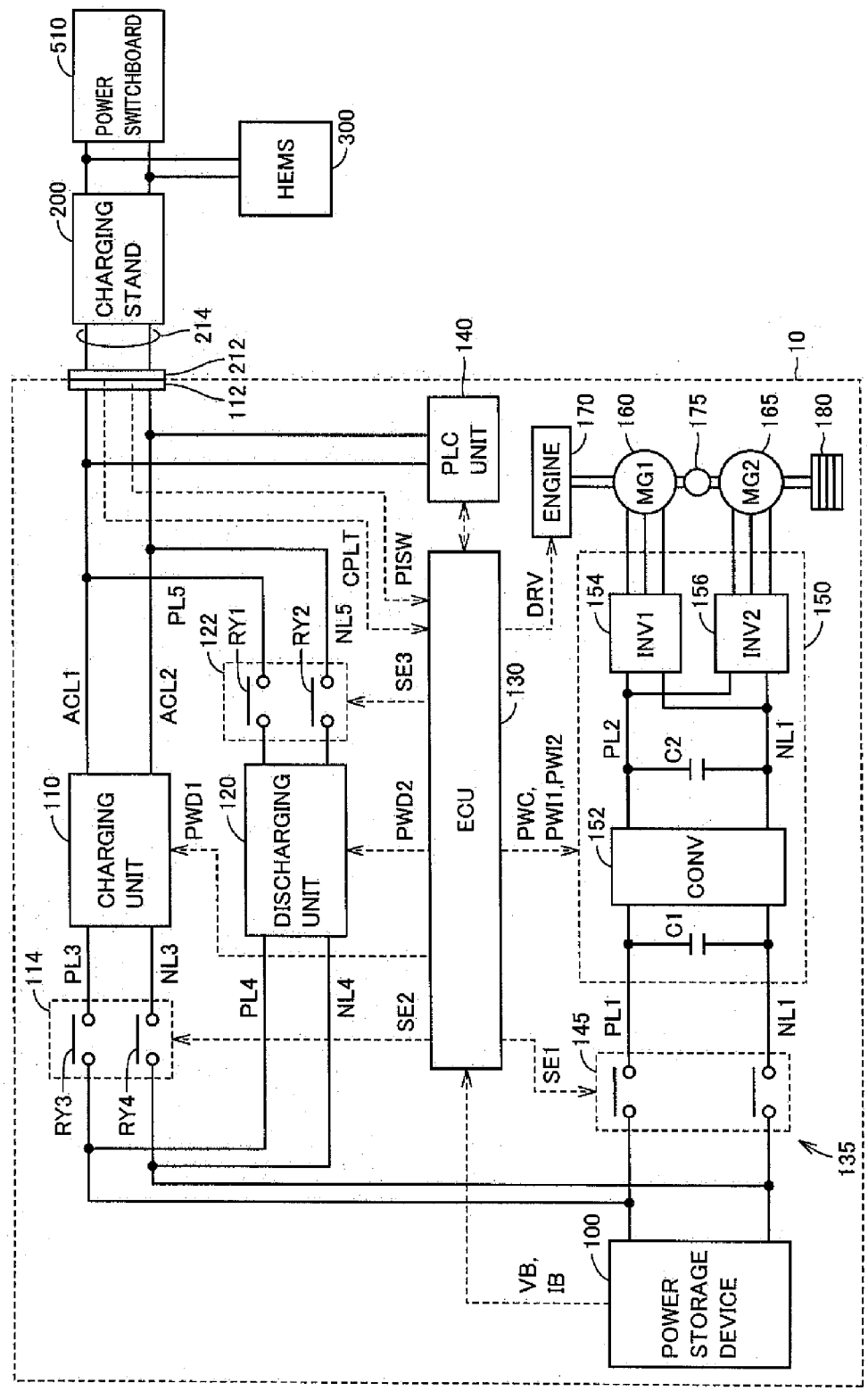
FIG. 2 is a diagram illustrating the configuration of a vehicle in FIG. 1.

Referring to FIG. 2, the configuration of vehicle 10 (FIG. 1) will be further described.

Referring to FIG. 2, motive power output device 135 includes a system main relay 145, a power control unit (PCU) 150, motor generators 160, 165, a power transmission gear 175, an engine 170, and a driving wheel 180.

PCU 150 is connected to power storage device 100. Power storage device 100 supplies the electric power for generating driving power for vehicle 10 to PCU 150. Furthermore, power storage device 100 stores the electric power generated in motor generators 160 and 165. Specifically, PCU 150 includes a converter 152, inverters 154 and 156, and capacitors C1 and C2.

Converter 152 performs voltage conversion based on a control signal PWC from ECU 130 between power lines PL1, NL1 and power lines PL2, NL1.

Inverters 154 and 156 are connected in parallel to power lines PL2 and NL1, respectively. Inverters 154 and 156 convert direct-current (DC) power supplied from converter 152 into alternating-current (AC) power based on control signals PMI1 and PMI2 from ECU 130, and drive motor generators 160 and 165, respectively.

Capacitor C1 is provided between power lines PL1 and NL1, and reduces the voltage variation between power lines PL1 and NL1.

Between power storage device 100 and PCU 150, system main relay 145 interposed in each of power lines PL1 and NL1 is provided. System main relay 145 is turned on/off in response to a relay control signal SE1 from ECU 130. System main relay 145 is used as a representative example of a "switching device" that can interrupt a charging/discharging path of power storage device 100. In other words, an optional type of switching device can be applied in place of system main relay 145.

Motor generators 160 and 165 each are an AC rotating electric machine, and, for example, a permanent-magnet type synchronous motor having a rotor incorporating a permanent magnet.

The output torque of each of motor generators 160 and 165 is transmitted to driving wheel 180 through power transmission gear 175 including a reduction gear and a power split device, for allowing vehicle 10 to run. Motor generators 160 and 165 can generate electric power by the rotating force of driving wheel 180 during regenerative braking of vehicle 100. PCU 150 then converts the generated electric power into charging power for power storage device 100.

Furthermore, motor generators 160 and 165 are coupled also to engine 170 through power transmission gear 175. Then, motor generators 160, 165 and engine 170 are cooperatively operated by ECU 130 to generate required vehicle driving force. Furthermore, motor generators 160 and 165 can generate electric power by rotation of engine 170, and can charge power storage device 100 using this generated electric power. In addition, in the present embodiment, motor generator 165 is used as an electric motor solely for driving the driving wheel 180 while motor generator 160 is used as a power generator solely driven by engine 170.

Although FIG. 2 shows a configuration in which two motor generators are provided, the number of motor generators is not limited to this, but the number of motor generators may be one, or may be two or more.

As a configuration for charging power storage device 100 with the electric power from external power supply 500, vehicle 10 further includes an inlet 112 provided in the body of vehicle 10, a charging unit 110 and a charge relay 114. In addition, external power supply 500 is representatively formed of a single-phase AC commercial power supply. In place of this commercial power supply or in addition to this commercial power supply, the electric power for the external power supply may be supplied by the electric power generated by a solar battery panel installed in a house roof and the like.

A power feeding connector 212 of a power feeding cable 214 is connected to inlet 112. Then, the electric power from external power supply 500 is transmitted to vehicle 10 through power feeding cable 214. In addition, in place of the configuration shown in FIGS. 1 and 2, there may be provided a configuration in which electric power is supplied in the state where the external power supply and the vehicle are electromagnetically coupled to each other while being kept out of contact with each other, specifically, in which a primary coil is provided on the external power supply side while a secondary coil is provided on the vehicle side, and mutual inductance between the primary coil and the secondary coil is utilized to supply electric power.

Charging unit 110 serves as a device receiving electric power from external power supply 500 for charging power storage device 100. Charging unit 110 is connected to inlet 112 through power lines ACL1 and ACL2. Furthermore, charging unit 110 is connected to power storage device 100 via charge relay 114 through power lines PL3 and NL3.

According to a control instruction PWD1 from ECU 130, charging unit 110 converts the AC power supplied from inlet 112 into DC power for charging power storage device 100.

Between charging unit 110 and power storage device 100, charge relay 114 interposed in each of power lines PL3 and NL3 is provided. Charge relay 114 is turned on/off in response to a relay control signal SE2 from ECU 130. Specifically, charge relay 114 is turned on (closed) in response to relay control signal SE2 indicating a closing instruction from ECU 130, and turned off (opened) in response to relay control signal SE2 indicating an opening instruction from ECU 130. Charge relay 114 is used as a representative example of the switching device capable of interrupting the charging path of power storage device 100. In other words, an optional type of switching device can be applied in place of charge relay 114.

During charging of power storage device 100 by external power supply 500, ECU 130 generates control instruction PWD1 for controlling charging unit 110, and outputs the generated control instruction PWD1 to charging unit 110. In this case, ECU 130 identifies the type of external power supply 500 based on the pilot signal received from a PLC unit (not shown) used for switching between supply and cut-off of the electric power from external power supply 500 and provided in a power line portion of power feeding cable 214. In accordance with the identified type of external power supply 500, ECU 130 controls charging unit 110.

Furthermore, vehicle 10 further includes a discharging unit 120 and a discharge relay 122 as a configuration for supplying, to load device 400 (FIG. 1) external to the vehicle, the DC power from power storage device 100 or the DC power converted in PCU 150 from the electric power generated by motor generators 160 and 165.

In other words, vehicle 10 according to the present embodiment is configured such that vehicle-mounted power storage device 100 can be charged by external power supply 500 and that the electric power from vehicle 10 can be supplied to load device 400 external to the vehicle. In the following description, charging of power storage device 100 by external power supply 500 is also referred to as a "charging operation" while supply of the electric power discharged from power storage device 100 and/or supply of the electric power generated by motive power output device 135 (motor generator 160) is also referred to as a "discharging operation".

Furthermore, in the present embodiment, power feeding cable 214 can be used in such a manner that it is switched between a charging operation and a discharging operation. Power feeding connector 212 of power feeding cable 214 includes a terminal portion having a shape similar to that of the terminal portion of the charging connector of the charging cable used for external charging, and can be connected to inlet 112 of vehicle 10. In addition to the configuration of the charging connector, power feeding connector 212 is also provided with a changing switch. This changing switch serves as a switch for switching between the charging operation and the discharging operation. This changing switch is switched to "discharge", thereby causing vehicle 10 to perform a discharging operation.

Specifically, the electric power discharged from power storage device 100 and/or the electric power generated from motive power output device 135 (motor generator 160) is/are transmitted to load device 400 through power feeding cable 214. In other words, power storage device 100 and/or motive power output device 135 (motor generator 160) correspond(s) to a "power generation device" for generating electric power to be supplied to outside the vehicle.

Discharging unit 120 serves as a device receiving the electric power discharged from power storage device 100 and/or the electric power generated from motive power output device 135 for supplying the received electric power to load device 400 external to the vehicle. Discharging unit 120 is connected to power lines ACL1 and ACL2 via discharge relay 122 through power lines PL5 and NL5. Furthermore, discharging unit 120 is connected to power storage device 100 via power lines PL4 and NL4 through power lines PL3 and NL3.

According to a control instruction PWD2 from ECU 130, discharging unit 120 converts the electric power discharged from power storage device 100 transmitted through power lines PL3, NL3, PL4, and NL4 and/or the electric power generated from motive power output device 135 (each power is DC power) into AC power for driving load device 400 external to the vehicle.

Discharge relay 122 interposed in each of power lines PL5 and NL5 is provided between discharging unit 120 and each of power lines ACL1 and ACL2. Discharge relay 122 is turned on/off in response to a relay control signal SE3 from ECU 130. Specifically, discharge relay 122 is turned on (closed) in response to relay control signal SE3 indicating a closing instruction from ECU 130, and turned off (opened) in response to relay control signal SE3 indicating an opening instruction from ECU 130. Discharge relay 122 is used as a representative example of a switching device capable of interrupting the discharging path from power storage device 100 and/or motive power output device 135. In other words, an optional type of switching device can be applied in place of discharge relay 122.

ECU 130 includes a CPU (Central Processing Unit), a storage device and an input and output buffer which are not shown in FIGS. 1 and 2. ECU 130 receives a signal from each sensor and the like and outputs a control signal to each device, and also controls vehicle 10 and each device. It is to be noted that the above-described control is not limited to the process by software, but can be carried out by dedicated hardware (an electronic circuit).

ECU 130 calculates a state of charge (SOC) of power storage device 100 based on the voltage and the current of power storage device 100 transmitted from a battery sensor that is not shown. The SOC shows the present remaining capacity with respect to the fully charged capacity on a percentage basis (0 to 100%). Since the SOC of power storage device 100 can be calculated by applying the well-known arbitrary method, detailed description thereof is omitted.

ECU 130 transmits information through a power line to and from a PLC unit 230 (FIG. 1) provided in a charging stand 200 external to the vehicle via PLC unit 140 coupled to power lines ACL1 and ACL2.

ECU 130 receives a signal PISW showing the connection state of power feeding cable 214 from power feeding connector 212. ECU 130 also receives a pilot signal CPLT from PLC unit 230 of power feeding cable 214. ECU 130 performs a charging operation based on these signals as will be described later with reference to FIG. 3.

Again referring to FIG. 1, charging stand 200 includes power feeding cable 214, power feeding connector 212, and relays 210 and 220 for performing the above-described charging operation and discharging operation. Charging stand 200 further includes PLC unit 230. Charging stand 200 is electrically connected to a power switchboard 510 installed within a building such as a house 600.

Power feeding cable 214 has one end branching into two, which are connected to relays 210 and 220, respectively, and also has the other end connected to power feeding connector 212. Power feeding cable 214 may be separable from charging stand 200. Although one cable and one connector are switched between the charging operation and the discharging operation to be used, a charging cable and a charging connector, and a discharging cable and a discharging connector may be separately provided.

During the charging operation, in the state where power feeding connector 212 is connected to inlet 112 of vehicle 10 and relay 210 is closed, electric power is supplied from external power supply 500 to vehicle 10 through power switchboard 510 of house 600. On the other hand, during the discharging operation, in the state where power feeding connector 212 is connected to inlet 112 of vehicle 10 and relay 220 is closed, electric power is supplied from vehicle 10 to house 600. The switching operation of each of relays 210 and 220 is controlled by PLC unit 230.

HEMS 300 is installed inside or outside of house 600. HEMS 300 is electrically connected to power switchboard 510 and charging stand 200. HEMS 300 includes a DC/AC converter 310, an AC/DC converter 320 and a storage battery 330.

AC/DC converter 320 converts the AC power supplied from charging stand 200 into DC power. DC/AC converter 310 converts the DC power converted by AC/DC converter 320 into AC power. AC/DC converter 320 and DC/AC converter 310 each are controlled based on the signal transmitted from PLC unit 230 of charging stand 200 and showing whether the charging operation or the discharging operation is selected. Accordingly, when performing a discharging operation, the electric power supplied from vehicle 10 through charging stand 200 is supplied to storage battery 330 through AC/DC converter 320.

Storage battery 330 is a rechargeable power storage element, for which a secondary battery such as a lithium-ion battery, a nickel-metal hydride battery or lead acid battery is typically applied. In addition to the electric power from vehicle 10, the electric power generated by a solar battery panel (not shown) installed in house 600 may be supplied to storage battery 330. Furthermore, the electric power from external power supply 500 may be supplied to storage battery 330. By way of example, the electric power in a midnight power time zone cheaper in electricity charges than the electric power during the daytime is supplied to storage battery 330. In this case, DC/AC converter 310 converts the AC power supplied from external power supply 500 into charging power for storage battery 330.

Load device 400 is any electrical device that operates with the electric power received from external power supply 500 through power switchboard 510. Load device 400 may be house 600 or an individual electrical appliance, for example. Alternatively, load device 400 may be a vehicle other than vehicle 10.

Figure 3:
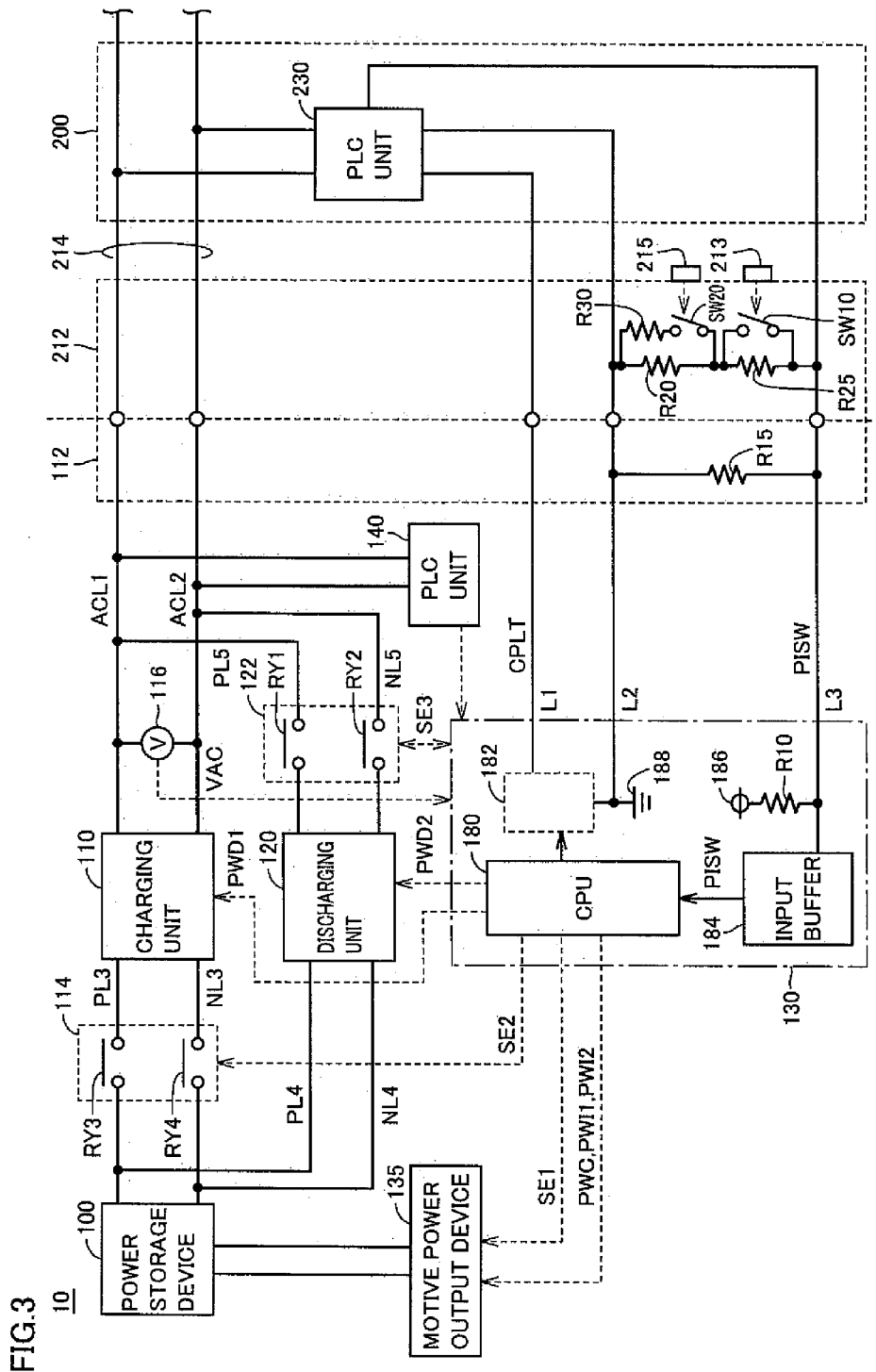
FIG. 3 is a block diagram for illustrating a charging operation and a discharging operation of the vehicle according to the present embodiment.

FIG. 3 is a block diagram for illustrating a charging operation and a discharging operation of vehicle 10 according to the present embodiment. In FIG. 3, description of the components designated by the same reference characters as those in FIGS. 1 and 2 will not be repeated.

Referring to FIG. 3, PLC unit 230 outputs pilot signal CPLT to ECU 130 through power feeding connector 212 and inlet 112. This pilot signal CPLT serves as a signal from PLC unit 230 for notifying ECU 130 about the rated current of power feeding cable 214. Furthermore, pilot signal CPLT is used also as a signal for remotely operating a CCID relay (not shown) interposed in the power line within power feeding cable 214 from ECU 130 based on the potential of pilot signal CPLT operated by ECU 130. PLC unit 230 controls the CCID relay based on the potential change in pilot signal CPLT.

The configuration of each of the above-described pilot signal CPLT and connection signal PISW is standardized, for example, by SAE (Society of Automotive Engineers) in the U.S., Japan Electric Vehicle Association, and the like.

When the potential of pilot signal CPLT is a prescribed potential (for example, 12V), PLC unit 230 outputs a non-oscillated signal. When the potential of pilot signal CPLT is decreased from the above-mentioned prescribed potential (for example, 9V), PLC unit 230 performs control to output a signal oscillating at a prescribed frequency (for example, 1 kHz) and in a prescribed duty cycle.

In addition, the potential of pilot signal CPLT is manipulated by ECU 130. Furthermore, the duty cycle is set based on the rated current that can be supplied from external power supply 500 through power feeding cable 214 to vehicle 10. Specifically, the pulse width of pilot signal CPLT is set based on the rated current that can be supplied from external power supply 500 through power feeding cable 214 to vehicle 10. By the duty shown by the ratio of the pulse width to this oscillation cycle, PLC unit 230 notifies ECU 130 of vehicle 10 about the rated current by using pilot signal CPLT.

Based on the duty of pilot signal CPLT received through a control pilot line L1, ECU 130 can detect the rated current that can be supplied to vehicle 10 through power feeding cable 214. When the potential of pilot signal CPLT is lowered by ECU 130 (for example, 6V), PLC unit 230 closes the contact of the CCID relay to bring about a conduction state.

A connection detection circuit including resistances R20, R25 and a switch SW10 is included in power feeding connector 212. Resistances R20 and R25 are connected in series between a connection signal line L3 and a ground line L2. Switch SW10 is connected in parallel with resistance R25.

Switch SW10, which is for example a limit switch, is closed at the contact in the state where power feeding connector 212 is securely fit into inlet 112. In the state where power feeding connector 212 is separated from inlet 112 and the case where power feeding connector 212 is insecurely fit into inlet 112, the contact of switch SW10 is opened. Furthermore, switch SW10 is opened at the contact also by operating an operation unit 213 that is provided in power feeding connector 212 and operated by the user when power feeding connector 212 is removed from inlet 112.

In the state where power feeding connector 212 is separated from inlet 112, a voltage signal defined by a voltage on a power supply node 186 and a pull-up resistance R10 that are included in ECU 130 and also by a resistance R15 provided in inlet 112 is generated on a connection ine L3 as a connection signal PISW. Furthermore, in the state where power feeding connector 212 is connected to inlet 112, a voltage signal in accordance with the combined resistance obtained by combination of resistances R15, R20 and R25 is generated on connection signal line L3, corresponding to the fitting state, the operation state of operation unit 213, and the like.

By detecting a potential on connection signal line L3 (that is, a potential of connection signal PISW), ECU 130 can determine the connection state and the fitting state of power feeding connector 212.

In vehicle 10, ECU 130 further includes a CPU 180, a resistance circuit 182, and an input buffer 184, in addition to power supply node 186 and pull-up resistance R10 described above.

Resistance circuit 182 is connected between a vehicle ground 188 and control pilot line L1 through which pilot signal CPLT is transmitted. Resistance circuit 182 is a circuit for manipulating the potential of pilot signal CPLT from the vehicle 10 side according to the control signal from CPU 180.

Input buffer 184 receives connection signal PISW through connection signal line L3 connected to the connection detection circuit of power feeding connector 212, and outputs the received connection signal PISW to CPU 180. As described above, ECU 130 applies a voltage to connection signal line L3, and the potential of connection signal PISW is changed by connection of power feeding connector 212 to inlet 112. CPU 180 detects the potential of this connection signal PISW, thereby detecting the connecting state and the fitting state of power feeding connector 212.

Furthermore, CPU 180 detects the oscillation state and the duty cycle of pilot signal CPLT, thereby detecting a rated current of power feeding cable 214.

Then, based on the potential of connection signal PISW and the oscillation state of pilot signal CPLT, CPU 180 controls resistance circuit 182, to thereby manipulate the potential of pilot signal CPLT. Consequently, CPU 180 can remotely operate a CCID relay. Then, electric power is transmitted from external power supply 500 to vehicle 10 through power feeding cable 214.

CPU 180 receives a voltage VAC that is supplied from external power supply 500 and detected by a voltage sensor 116 provided between power lines ACL1 and ACL2.

In the above-described configuration, when the contact of the CCID relay is closed, the AC power from external power supply 500 is supplied to charging unit 110, to complete the preparation for charging power storage device 100 from external power supply 500. CPU 180 outputs a control signal PWD1 to charging unit 110, thereby converting the AC power from external power supply 500 into charging power for power storage device 100. Then, relay control signal SE2 (a closing instruction) is output to close the contact of charge relay 114, thereby charging power storage device 100.

Furthermore, when the SOC of power storage device 100 reaches a prescribed fully-charged state or when an instruction is given from a user, CPU 180 causes the contact of charge relay 114 to be opened, and controls charging unit 110 to stop power conversion, thereby ending the charging operation.

In order to switch from the charging operation described above to the discharging operation, a changing switch 215 provided in power feeding connector 212 is switched from "charge" to "discharge". In addition to changing switch 215, power feeding connector 212 is further provided in the connection detection circuit with a resistance R30 and a switch SW20.

Resistance R30 and switch SW20 connected in series are connected in parallel with resistance R20 of the connection detection circuit. Switch SW20, which is interlocked with changing switch 215, is closed when changing switch 215 is set as "discharge" and opened when changing switch 215 is set as "charge".

According to the above-described configuration, in the case where changing switch 215 is set as "charge", based on the potential of connection signal PISW that changes in accordance with the combined resistance defined by the combination of resistances R10, R15, R20, and R25 as described above, the connection state and the fitting state of power feeding connector 212 are recognized, and the charging operation is performed.

On the other hand, in the case where changing switch 215 is set as "discharge", a resistance R40 is added to the combined resistance by closing switch SW20. In the state where power feeding connector 212 is fit (that is, switch SW10 is closed), resistances R15, R20 and R30 are connected in parallel between connection signal line L3 and ground line L2. Accordingly, the potential on connection signal line L3 (that is, the potential of connection signal PISW) is decreased as compared with the case where changing switch 215 is set as "charge". In this way, the potential of connection signal PISW in the state where power feeding connector 212 is fit shows a different value between the case where changing switch 215 is set as "charge" and the case where changing switch 215 is set as "discharge". Accordingly, CPU 180 can recognize switching between the charging operation and the discharging operation.

Then, when recognizing that the discharging operation is set, CPU 180 outputs relay control signal SE2 (an opening instruction) to open the contact of charge relay 114, and outputs relay control signal SE3 (a closing instruction) to close the contact of discharge relay 122. Furthermore, CPU 180 controls discharging unit 120 to perform a discharging operation, to supply the electric power from power storage device 100 to load device 400 external to the vehicle. Furthermore, when the SOC of power storage device 100 is decreased, or when an instruction is given from a user, engine 170 is driven to cause motor generator 160 to generate electric power, and supply the generated electric power to load device 400.

[Determination about Welding of Discharge Relay]

As described above, in the present embodiment, when power feeding connector 212 is connected to inlet 112, the potential of connection signal PISW is changed, thereby causing ECU 130 to recognize switching between the charging operation and the discharging operation.

Then, when switching from the charging operation to the discharging operation, ECU 130 outputs relay control signal SE3 (a closing instruction) to close the contact of discharge relay 122, and outputs relay control signal SE2 (an opening instruction) to open the contact of charge relay 114, thereby connecting discharging unit 120 between power lines ACL1, ACL2 and power lines PL3, NL3, respectively. This results in formation of a discharging path for transmitting the electric power discharged from power storage device 100 and/or the electric power generated by motive power output device 135 (motor generator 160) to power lines ACL1 and ACL2 through discharging unit 120.

Furthermore, when switching from the discharging operation to the charging operation, ECU 130 outputs relay control signal SE3 (an opening instruction) to open the contact of discharge relay 122, and outputs relay control signal SE2 closing instruction) to close the contact of charge relay 114, thereby connecting charging unit 110 between power lines ACL1, ACL2 and power lines PL3, NL3, respectively. This results in formation of a charging path for transmitting the electric power from external power supply 500 to power lines PL3 and NL3 through charging unit 110.

When the contact of discharge relay 122 is welded, however, discharging unit 120 and power lines ACL1, ACL2 are electrically connected through discharge relay 122. Accordingly, when charging unit 110 is caused to start the charging operation in this state, the AC power from external power supply 500 may flow into discharging unit 120 through discharge relay 122. When such a situation occurs, a voltage is applied to the output side of the AC inverter provided in discharging unit 120 and converting the voltage of power storage device 100 into an AC voltage (for example, AC 100V), which may cause damage to the AC inverter. Therefore, in order to prevent damage to discharging unit 120, it is necessary to determine whether the contact of discharge relay 122 is welded or not.

In this case, as a method for determining whether discharge relay 122 is welded or not, it is possible to perform determination about welding of discharge relay 122 when the discharging operation is started, in accordance with the determination about welding at system main relay 145 (FIG. 2) provided between power storage device 100 and PCU 150.

However, if determination about welding of discharge relay 122 is performed at the start of the discharging operation, this welding can no longer be detected when the contact of discharge relay 122 is welded during execution of the discharging operation. Accordingly, when the charging operation is performed after the end of the discharging operation, it cannot be possible to avoid such a situation that a voltage is applied to discharging unit 120 as described above.

The above-described situation can be avoided by performing determination about welding of discharge relay 122 also at the start of the charging operation in addition to the start of the discharging operation. However, if determination about welding of discharge relay 122 is performed both at the start of the discharging operation and at the start of the charging operation, it becomes necessary to additionally perform an operation for turning on/off discharge relay 122 in order to start the charging operation. This increases the number of operations of discharge relay 122, which may cause a decrease in durability of discharge relay 122. Also, the process of the charging operation may be delayed.

Thus, in the present embodiment, determination about welding of discharge relay 122 is performed not at the start of the discharging operation but at the end of the discharging operation. In this case, when the charging operation is performed after the end of the discharging operation, it has been determined at the end of the discharging operation that discharge relay 122 is not welded. Accordingly, the electric power from external power supply 500 does not flow into discharging unit 120 through discharge relay 122.

Furthermore, when the discharging operation is performed again after the end of the discharging operation, the result of determination about the presence or absence of welding at discharge relay 122 that is performed at the end of the previous discharging operation can be regarded, as it is, as a result of determination about the presence or absence of welding at discharge relay 122 at the start of the discharging operation. Therefore, the discharging operation can be started immediately without having to perform determination about welding of discharge relay 122 again at the start of the discharging operation.

Furthermore, by performing determination about welding of discharge relay 122 at the end of the discharging operation in this way, determination about welding of discharge relay 122 does not have to be performed both when the discharging operation is switched to the charging operation and when the discharging operation is performed again. Consequently, the number of operations of discharge relay 122 is reduced. Therefore, the durability of discharge relay 122 can be improved.

Figure 4:
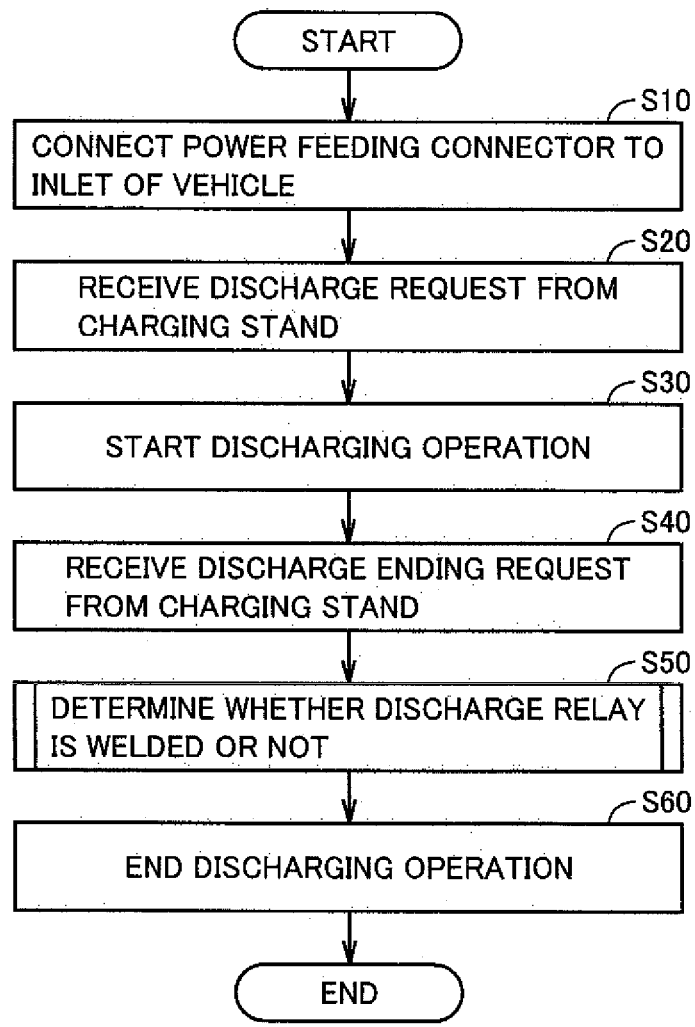
FIG. 4 is a flowchart illustrating a procedure of a controlling process for implementing determination about welding of a discharge relay in the vehicle, according to the present embodiment.

FIG. 4 is a flowchart illustrating a procedure of a controlling process for implementing determination about welding of discharge relay 122 in the vehicle, according to the present embodiment. In the flowchart in FIG. 4, the process is implemented by executing the program stored in CPU 180 in advance in predetermined cycles. Alternatively, the process may also be implemented for a portion of the steps by developing dedicated hardware (electronic circuit).

Referring to FIG. 4, in step S10, ECU 130 of vehicle 10 determines based on the potential of connection signal PISW that power feeding connector 212 is connected to inlet 112. Furthermore, ECU 130 determines based on the potential of connection signal PISW that changing switch 215 is set as "discharge".

Then, the process proceeds to step S20, in which ECU 130 receives, from PLC unit 230 within charging stand 200, a discharge request for requesting to start a discharging operation. This discharge request is for example a signal activated when power feeding connector 212 is connected to inlet 112 and changing switch 215 provided in power feeding connector 212 is set as "discharge" by the user. Alternatively, the discharge request may be activated when the switch provided in charging stand 200 or HEMS 300 for instructing execution of the discharging operation is operated by the user, in the state where power feeding connector 212 is connected to inlet 112 and changing switch 215 provided in power feeding connector 212 is set as "discharge" by the user.

ECU 130 starts a discharging operation in step S30. ECU 130 controls discharging unit 120 to perform the discharging operation, and also drives engine 170 as necessary to perform a power generation operation.

When receiving a discharge ending request from PLC unit 230 within charging stand 200 in step S40 during execution of the discharging operation in step S30, ECU 130 performs a process of ending the discharging operation. This discharge ending request is for example a signal activated when the operation to the switch for instructing execution of the above-described discharging operation is cancelled or when the switch does not accept the operation from the user.

In the process of ending the discharging operation, ECU 130 stops the operation of the AC inverter forming discharging unit 120, and opens the contact of discharge relay 122. Then, in this process of ending the discharging operation, ECU 130 determines in step S50 whether discharge relay 122 is welded or not. When it is determined whether discharge relay 122 is welded or not, in S60, ECU 130 stops the operation of the AC inverter forming discharging unit 120, thereby ending the discharging operation.

Figure 5:
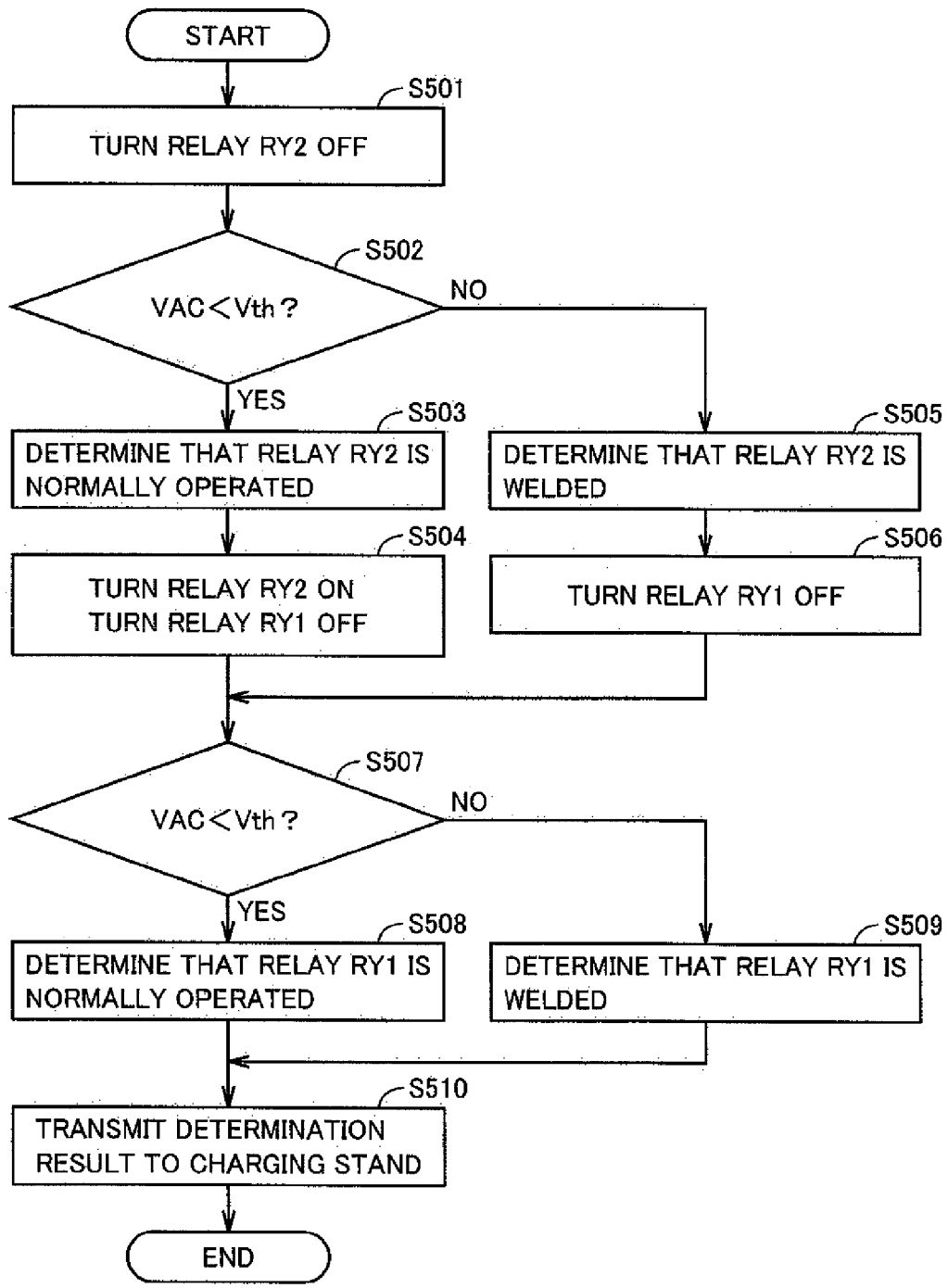
FIG. 5 is a flowchart illustrating the process of step S50 in FIG. 4 in detail.

FIG. 5 is a flowchart illustrating the process of step S50 in FIG. 4 in greater detail. Referring to FIGS. 2 and 3, discharge relay 122 includes a relay RY1 interposed in power line PL5 connecting discharging unit 120 and power line ACL1; and a relay RY2 interposed in power line NL5 connecting discharging unit 120 and power line ACL2.

In the present embodiment, ECU 130 outputs relay control signal SE3 (an opening instruction) for alternately opening the contacts of these two relays RY1 and RY2, and detects voltage VAC between power lines ACL1 and ACL2 at the time when one of the relays is opened (OFF), thereby determining whether welding occurs or not.

Specifically, referring to FIG. 5, in step S501, ECU 130 outputs relay control signal SE3 to thereby open the contact of relay RY2 (OFF). In step S502, ECU 130 causes voltage sensor 116 to detect AC voltage VAC supplied to power lines ACL1 and ACL2 in the state where the contact of relay RY2 is opened. Then, ECU 130 determines whether AC voltage VAC is lower than a threshold value Vth. Threshold value Vth is a determination value for determining whether supply of electric power is cut off or not between vehicle 10 and outside the vehicle.

When AC voltage VAC is not decreased to threshold value Vth (determined as NO in step S502), ECU 130 determines in step S505 that relay RY2 is welded. Then, the process proceeds to step S506, in which ECU 130 opens the contact of relay RY1 (OFF).

On the other hand, when AC voltage VAC is lower than threshold value Vth (determined as YES in step S502), ECU 130 determines in step S503 that relay RY2 is not welded, that is, relay RY2 is normally operated. Then, ECU 130 closes the contact of relay RY2 (ON) and opens the contact of relay RY1 (OFF).

In step S507, ECU 130 causes voltage sensor 116 to detect AC voltage VAC supplied to power lines ACL1 and ACL2 in the state where the contact of relay RY1 is closed in step S504 or S506. Then, ECU 130 determines whether AC voltage VAC is lower than threshold value Vth.

While AC voltage VAC is not decreased to threshold value Vth (determined as NO in step S507), ECU 130 determines in step S509 that relay RY1 is welded. On the other hand, when AC voltage VAC is lower than threshold value Vth (determined as YES in step S507), ECU 130 determines in step S508 that relay RY1 is not welded, that is, relay RY1 is normally operated. Then, the process proceeds to step S510, in which ECU 130 causes PLC unit 140 to transmit the result of determination about welding of discharge relay 122 (relays RY1 and RY2) to PLC unit 230 of charging stand 200. Charging stand 200 or HEMS 300 notifies the user about the received result of determination about welding of discharge relay 122 by means of a notification unit that is not shown.

(Modification)

Although an explanation has been given in FIG. 5 with regard to the configuration in which ECU 130 of vehicle 10 determines whether discharge relay 122 is welded or not, the similar effect can be achieved also by the configuration in which determination about welding of discharge relay 122 is performed on the charging stand 200 side or the HEMS 300 side.

Figure 6:
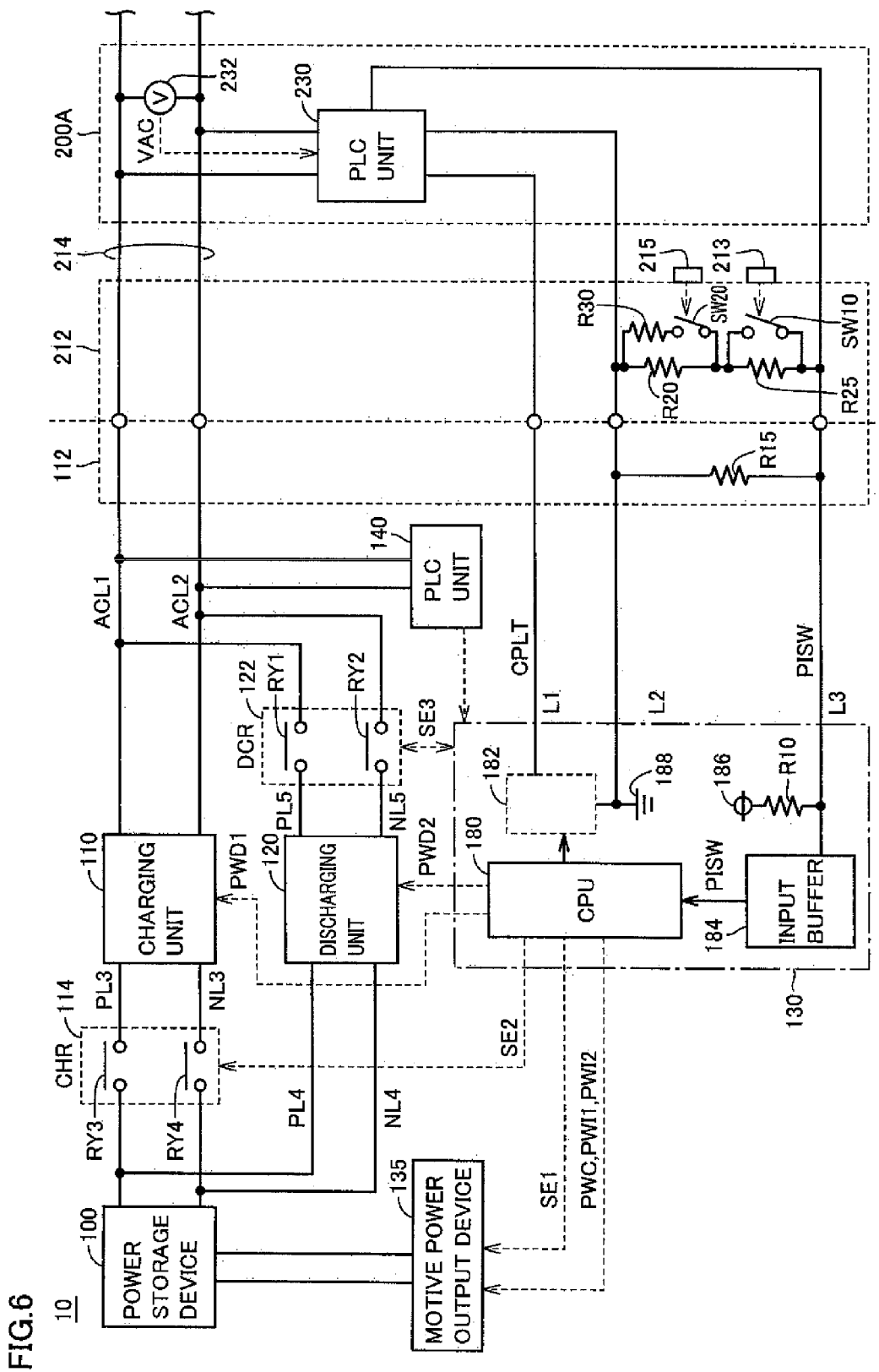
FIG. 6 is a block diagram for illustrating determination about welding of a discharge relay that is performed in a charging stand.

FIG. 6 is a block diagram for illustrating determination about welding of discharge relay 122 that is performed in charging stand 200. In FIG. 6, description of the components designated by the same reference characters as those in FIG. 3 will not be repeated.

Referring to FIG. 6, a charging stand 200A is provided with a voltage sensor 232 in addition to the configuration of charging stand 200 described with reference to FIG. 3. This voltage sensor 232 is connected to the power line within power feeding cable 214, detects voltage VAC of the AC power supplied to the power line, and outputs its detection value to PLC unit 230. In the process of ending the discharging operation, PLC unit 230 determines based on detection value VAC of voltage sensor 232 whether discharge relay 122 is welded or not. Then, PLC unit 230 transmits the result of determination about welding of discharge relay 122 to PLC unit 140 of vehicle 10.

Figure 7:
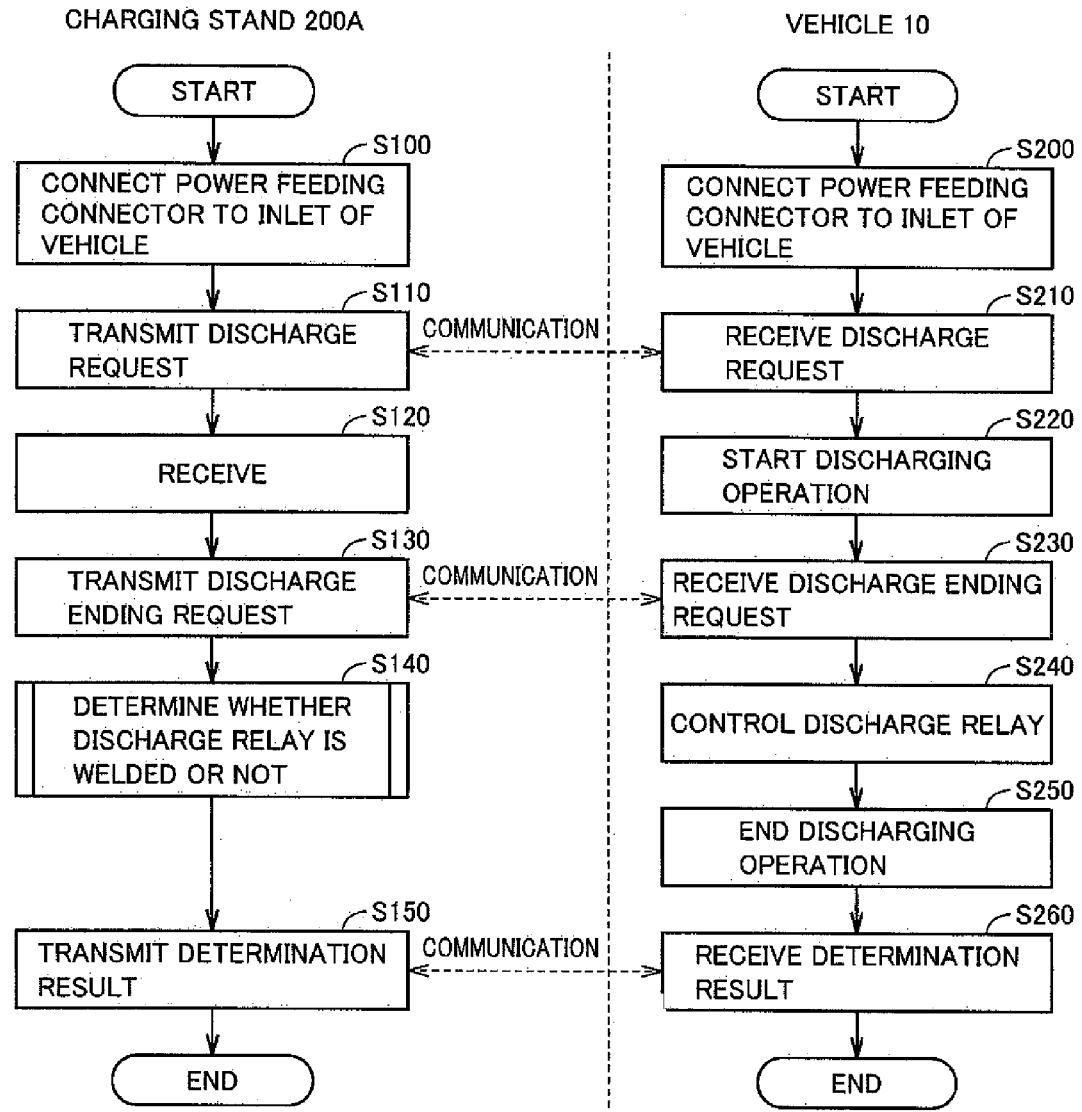
FIG. 7 is a flowchart illustrating a procedure of the controlling process for implementing determination about welding of the discharge relay that is performed in the charging stand in FIG. 6.

FIG. 7 is a flowchart illustrating a procedure of the controlling process for implementing determination about welding of discharge relay 122 that is performed in charging stand 200A in FIG. 6. In the flowcharts in FIG. 7, the process is implemented by executing the program stored in a CPU (not shown) within charging stand 200A in advance in predetermined cycles. Alternatively, the process may also be implemented for a portion of the steps by developing dedicated hardware (electronic circuit).

Referring to FIG. 7, ECU 130 outputs relay control signal SE3 for alternately opening the contacts of two relays RY1 and RY2 forming discharge relay 122 by the method similar to that in FIG. 5. Charging stand 200A determines whether welding occurs or not based on detection value VAC from voltage sensor 232 at the time when one of the relays is opened (OFF).

Specifically, referring to FIG. 7, in step S200, ECU 130 of vehicle 10 determines based on the potential of connection signal PISW that power feeding connector 212 is connected to inlet 112. Furthermore, ECU 130 determines based on the potential of connection signal PISW that changing switch 215 is set as "discharge".

In charging stand 200A, when power feeding connector 212 is connected to inlet 112 in step S100, PLC unit 230 transmits a discharge request to PLC unit 140 of vehicle 10 in step S110.

When ECU 130 of vehicle 10 receives the discharge request for requesting to start the discharging operation from PLC unit 230 within charging stand 200A in step S210, it starts the discharging operation in step S220. ECU 130 controls discharging unit 120 to perform a discharging operation, and also drives engine 170 as necessary to perform a power generation operation. Charging stand 200A supplies, to HEMS 300, the electric power from vehicle 10 transmitted through power feeding cable 214. HEMS 300 supplies the electric power from vehicle 10 to load device 400.

In charging stand 200A, PLC unit 230 transmits a discharge ending request to PLC unit 140 of vehicle 10 in step S130 during execution of the discharging operation in vehicle 10.

When receiving the discharge ending request through PLC unit 140, ECU 130 performs a process of ending the discharging operation. ECU 130 stops the operation of the AC inverter forming discharging unit 120 and opens the contact of discharge relay 122.

PLC unit 230 of charging stand 200A determines in step S140 whether discharge relay 122 is welded or not in this process of ending the discharging operation. Based on detection value VAC from voltage sensor 232 obtained while ECU 130 controls discharge relay 122, PLC unit 230 determines whether discharge relay 122 is welded or not.

Specifically, by the process similar to those in steps S501, S504 and S506 in FIG. 5, ECU 130 causes the contacts of relays RY1 and RY2 forming charge relay 114 to be alternately opened. By the process similar to those in steps S502, S503, S505, and S507 to S509 in FIG. 5, PLC unit 230 within charging stand 200A determines based on AC voltage VAC detected by voltage sensor 232 whether relays RY1 and RY2 are welded or not.

Then, the process proceeds to step S150, in which PLC unit 230 notifies the user of the result of determination about welding of discharge relay 122 (relays RY1 and RY2) by means of a notification unit that is not shown, and transmits the same determination result to PLC unit 140 of vehicle 10. In step S260, ECU 130 of vehicle 10 receives the result of determination about welding of discharge relay 122 through PLC unit 140.

Although an explanation has been given in the present embodiment with regard to the configuration in which welding of discharge relay 122 is determined based on voltage VAC of the AC power supplied to a power line, welding of discharge relay 122 may be determined based on the current of the AC power supplied to a power line. In other words, welding of discharge relay 122 can be determined based on the voltage and/or the current of the AC power supplied to a power line. In the present invention, a voltage and a current on the power line are collectively referred to as a "state of a power line".

[Determination about Welding of Charge Relay]

In FIGS. 4 to 7, welding of discharge relay 122 is determined at the end of the discharging operation, thereby preventing a voltage from being applied to discharging unit 120 through the welded discharge relay 122 when the discharging operation is switched to the charging operation.

It is to be noted that harmful effects caused by such welding of the relay may occur also in the situation where the charging operation is switched to the discharging operation. This is because, when the contact of charge relay 114 is welded, charging unit 110 is electrically connected to power lines PL3 and NL3 through charge relay 114, and accordingly, when discharging unit 120 is caused to start the discharging operation in such a state, the electric power from power storage device 100 and/or the electric power generated in motive power output device 135 consequently flows into charging unit 110 through charge relay 114. Therefore, determination about welding should be performed also for charge relay 114 as with discharge relay 122 described above.

On the other hand, when determination about welding of charge relay 114 is performed both at the start of the charging operation and at the start of the discharging operation, the number of operations of charge relay 114 increases, which may cause a decrease in durability of charge relay 114. Also, the process of the discharging operation may be delayed.

Therefore, in the present embodiment, determination about welding of charge relay 114 is performed for the purpose of protecting charge relay 114.

Figure 8:
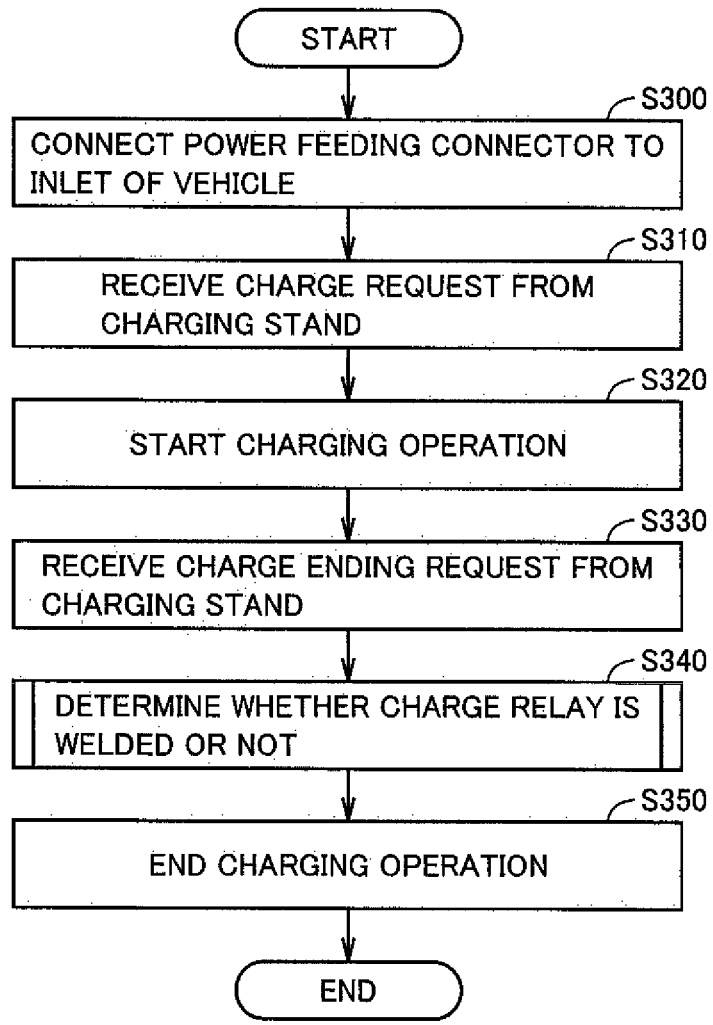
FIG. 8 is a flowchart illustrating a procedure of the controlling process for implementing determination about welding of the charge relay in the vehicle according to the present embodiment.

FIG. 8 is a flowchart illustrating a procedure of the controlling process for implementing determination about welding of charge relay 114 in the vehicle according to the present embodiment. In the flowchart in FIG. 8, the process is implemented by executing the program stored in CPU 180 in advance in predetermined cycles. Alternatively, the process may also be implemented for a portion of the steps by developing dedicated hardware (electronic circuit).

Referring to FIG. 8, in step S300, ECU 130 of vehicle 10 determines based on the potential of connection signal PISW that power feeding connector 212 is connected to inlet 112. Furthermore, ECU 130 determines based on the potential of connection signal PISW that changing switch 215 is set as "charge".

Then, the process proceeds to step S310, in which ECU 130 receives a charging request for requesting to start the charging operation from PLC unit 230 within charging stand 200. This charging request is for example a signal activated when power feeding connector 212 is connected to inlet 112 and changing switch 215 provided in power feeding connector 212 is set as "charge" by the user. Alternatively, the charging request may be activated when the user operates the switch provided in charging stand 200 or HEMS 300 for instructing execution of the charging operation, in the state where power feeding connector 212 is connected to inlet 112 and changing switch 215 provided in power feeding connector 212 is set as "charge" by the user.

In step S320, ECU 130 starts the charging operation. ECU 130 controls charging unit 110 to perform a charging operation.

During execution of the charging operation in step S320, when receiving a charge ending request from PLC unit 230 within charging stand 200 in step S330, ECU 130 performs the process of ending the charging operation. This charge ending request is for example a signal activated when the SOC of power storage device 100 reaches a prescribed fully-charged state. Alternatively, the discharge ending request may be activated when the operation to the switch for instructing execution of the above-described charging operation is cancelled, or when the switch does not accept the operation from the user.

In the process of ending the charging operation, ECU 130 stops the operation of the AC inverter forming charging unit 110 and opens the contact of charge relay 114. Then, in this process of ending the charging operation, ECU 130 determines in step S340 whether charge relay 114 is welded or not. Then, when it is determined whether charge relay 114 is welded or not, ECU 130 stops the operation of the AC inverter forming charging unit 110, thereby ending the charging operation in step S350.

Figure 9:
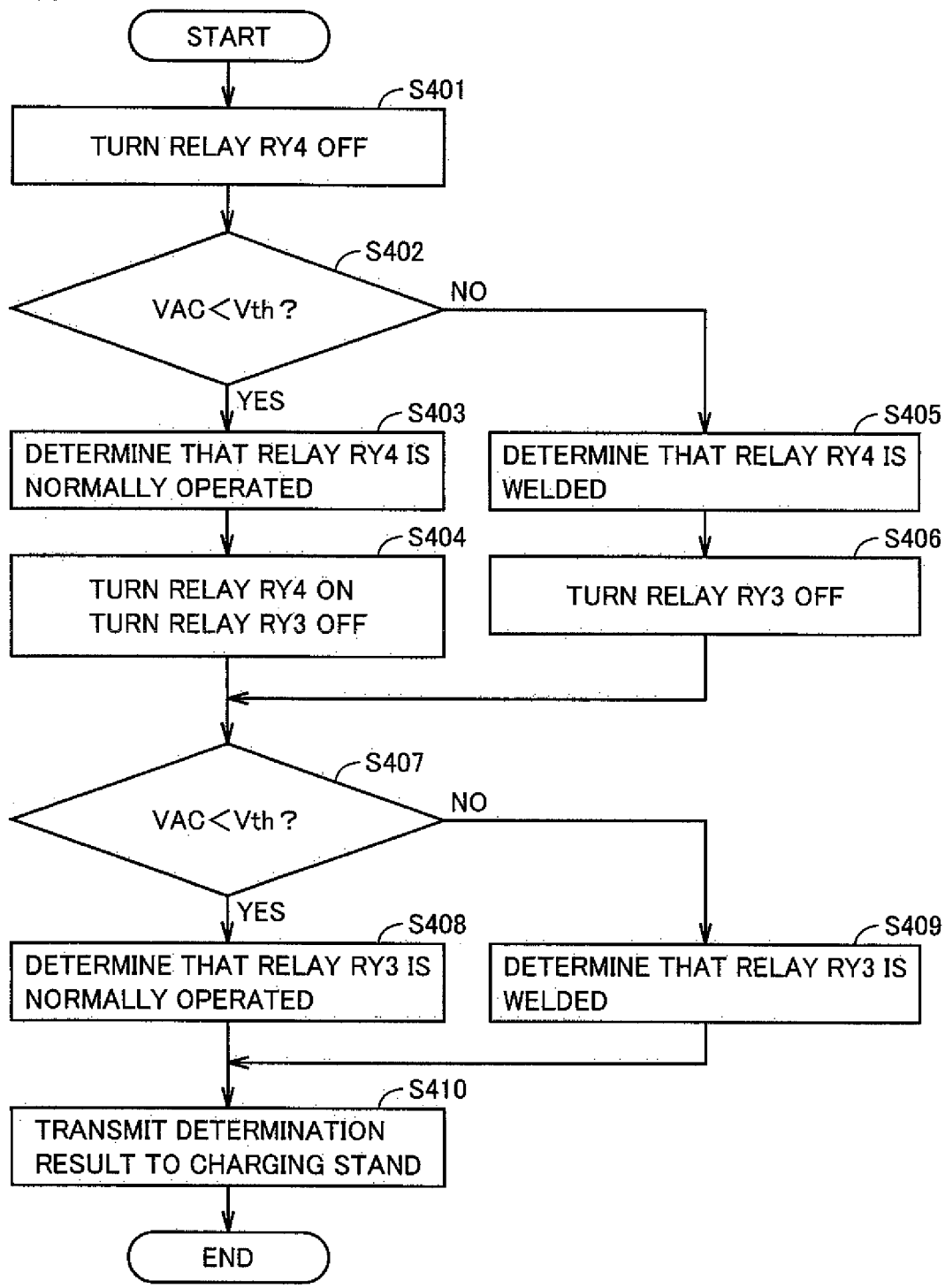
FIG. 9 is a flowchart illustrating the process of step S340 in FIG. 8 in detail.

FIG. 9 is a flowchart illustrating the process of step S340 in FIG. 8 in greater detail. Referring to FIGS. 2 and 3, charge relay 114 includes a relay RY3 interposed in power line NL3 connecting power storage device 100 and charging unit 110; and a relay RY4 interposed in power line NL3 connecting power storage device 100 and charging unit 110.

In the present embodiment, ECU 130 outputs relay control signal SE2 (an opening instruction) for alternately opening the contacts of these two relays RY3 and RY4, and detects voltage VAC between power lines ACL1 and ACL2 at the time when one of the relays is opened (OFF), thereby determining whether welding occurs or not.

Specifically, referring to FIG. 9, in step S401, ECU 130 outputs relay control signal SE2 to open the contact of relay RY4 (OFF). In step S402, ECU 130 causes voltage sensor 116 to detect AC voltage VAC supplied to power lines ACL1 and ACL2 in the state where the contact of relay RY4 is opened. Then, ECU 130 determines whether AC voltage VAC is lower than threshold value Vth. Threshold value Vth is a determination value for determining whether supply of electric power is cut off or not between vehicle 10 and outside the vehicle.

When AC voltage VAC is not decreased to threshold value Vth (determined as NO in step S402), ECU 130 determines in step S405 that relay RY4 is welded. Then, the process proceeds to step S406, in which ECU 130 opens the contact of relay RY3 (OFF).

On the other hand, when AC voltage VAC is lower than threshold value Vth (determined as YES in step S402), ECU 130 determines in step S403 that relay RY4 is not welded, that is, relay RY4 is normally operated. Then, ECU 130 closes the contact of relay RY4 (ON) while opening the contact of relay RY3 (OFF).

In step S407, ECU 130 causes voltage sensor 116 to detect AC voltage VAC supplied to power lines ACL1 and ACL2 in the state where the contact of relay RY3 is opened in step S404 or S406. Then, ECU 130 determines whether AC voltage VAC is lower than threshold value Vth.

When AC voltage VAC is not decreased to threshold value Vth (determined as NO in step S407), ECU 130 determines in step S409 that relay RY3 is welded. On the other hand, when AC voltage VAC is lower than threshold value Vth (determined as YES in step S407), ECU 130 determines in step S408 that relay RY3 is not welded, that is, relay RY3 is normally operated. Then, the process proceeds to step S410, in which ECU 130 causes PLC unit 140 to transmit the result of determination about welding of charge relay 114 (relays RY3, RY4) to PLC unit 230 of charging stand 200. Charging stand 200 or HEMS 300 notifies the user of the received result of determination about welding of charge relay 114 by means of a notification unit that is not shown.

As described above, according to the embodiment of the present invention, in a vehicle configured to be capable of switching between the charging operation of charging a vehicle-mounted power storage device with the electric power from an external power supply and a discharging operation of supplying the electric power from the power storage device to an external load so as to be executable, it becomes possible to reduce the number of operations of the switching device required for performing determination about welding of the switching device (a charge relay and a discharge relay) for switching between the charging operation and the discharging operation. Consequently, a decrease in durability of the switching device can be suppressed.

Furthermore, by suppressing a decrease in durability of the switching device, it becomes possible to construct a vehicle having excellent durability and a power supply system including the vehicle at low cost.

Figure 10:
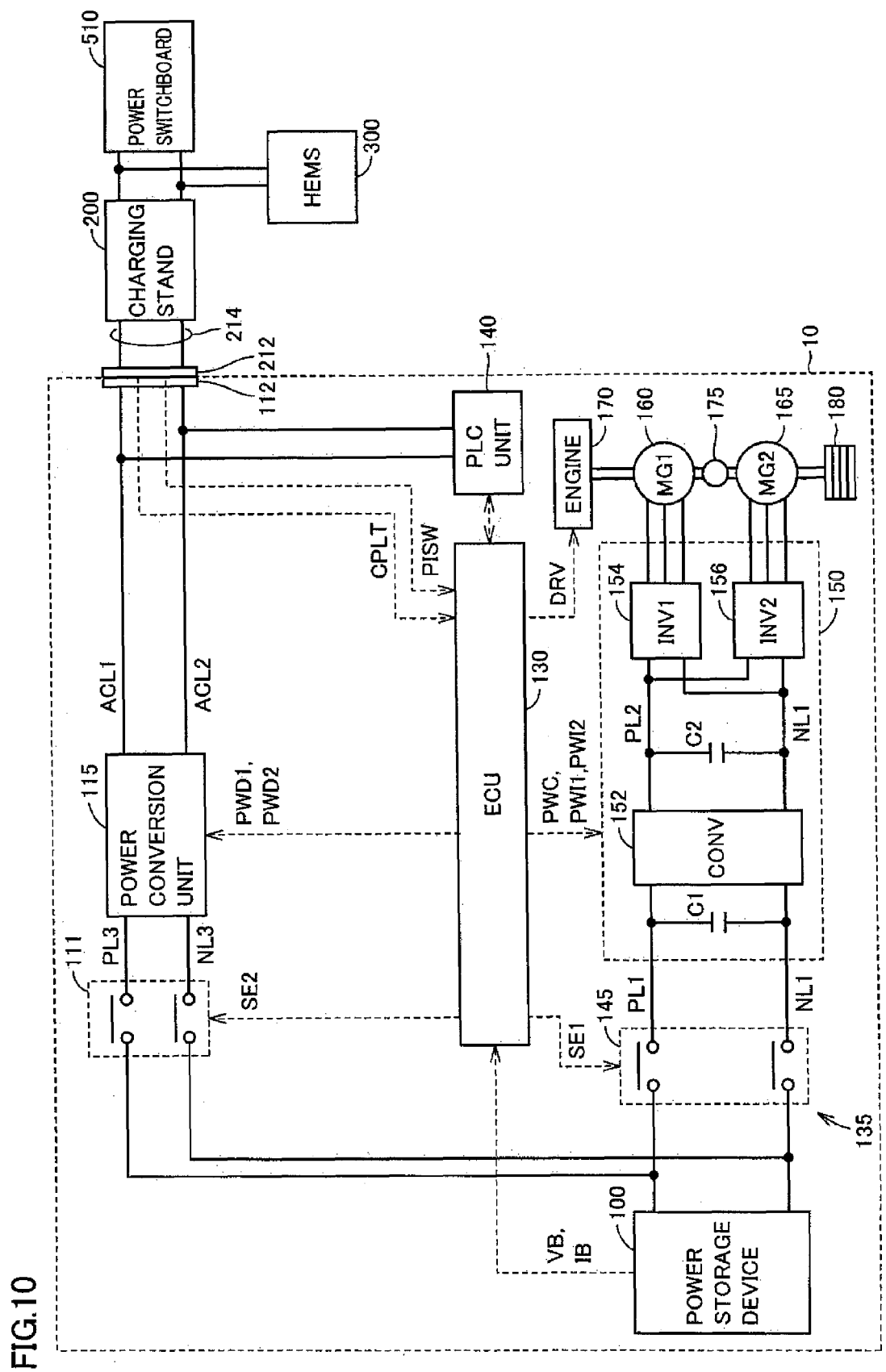
FIG. 10 is a schematic configuration diagram of a power supply system in the case where a bidirectional power converter is used.

Although the above-described embodiment has shown a configuration in which a charging unit and a discharging unit are arranged in parallel between a power storage device and outside the vehicle as one embodiment of the power conversion device performing power conversion between the vehicle-mounted power storage device and outside the vehicle, the present invention is also applicable to a bidirectional power converter integrally including these components, as shown in FIG. 10.

FIG. 10 is a schematic configuration diagram of a power supply system configured such that electric power is transmitted between the power storage device and outside the vehicle using a bidirectional power converter. Referring to FIG. 10, vehicle 100 includes a power conversion unit 115 in place of charging unit 110 and discharging unit 120 (FIG. 2).

Power conversion unit 115 is connected to inlet 112 through power lines ACL1 and ACL2. Power conversion unit 115 is also connected to power storage device 100 via relay 111 through power lines PL3 and NL3.

Power conversion unit 115 is controlled by control signal PWD1 from ECU 130 to convert the AC power supplied from inlet 112 into charging power for power storage device 100. Furthermore, power conversion unit 115 can also be controlled by a control signal PWD2 from ECU 130 to convert into, AC power, the DC power from power storage device 100 and/or the DC power converted in PCU 150 from the electric power generated by motor generators 160 and 165, to supply the converted power to outside of the vehicle.

Relay 111 is controlled by relay control signal SE2 from ECU 130, to switch between supply and cut-off of the electric power between power conversion unit 115 and power storage device 100. Although FIG. 10 shows a configuration in which relay 111 is interposed in each of power lines PL3 and NL3, relay 111 may be interposed in each of power lines ACL1 and ACL2.

ECU 130 does not performs determination about welding of relay 111 at the start of the power conversion operation (a charging operation or a discharging operation) in power conversion unit 115, but performs determination about welding of relay 111 at the end of the power conversion operation. Specifically, ECU 130 outputs relay control signal SE2 (an opening instruction) to open the contact of relay 111, thereby interrupting an electrical path between power storage device 100 and power conversion unit 115. Based on the states of power lines PL3 and NL3 during output of this relay control signal SE2, ECU 130 determines whether relay 111 is welded or not. According to this, since it is determined at the end of the previous power conversion operation whether relay 111 is welded or not, it becomes possible to reduce the number of operations of switching relay 111 again at the start of the power conversion operation. Therefore, since the number of operations of relay 111 required for determination about welding of relay 111, relay 111 can be reduced in size.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention can be applied to a power supply system for supplying electric power from a vehicle to a load external to the vehicle.

REFERENCE SIGNS LIST 10 vehicle, 100 power storage device, 110 charging unit, 111 relay, 112 inlet, 114 charge relay, 116, 232 voltage sensor, 120 discharging unit, 122 discharge relay, 135 motive power output device, 140, 230 PLC unit, 145 system main relay, 150 PCU, 152 converter, 154, 156 inverter, 160, 165 motor generator, 170 engine, 175 power transmission gear, 180 driving wheel, 182 resistance circuit, 184 input buffer, 186 power supply node, 188 vehicle ground, 200, 200A charging stand, 210, 220 relay, 212 power feeding connector, 213 operation unit, 214 power feeding cable, 215 changing switch, 310 AC/DC converter, 320 DC/AC converter, 330 storage battery, 400 load device, 500 external power supply, 510 power switchboard, 600 house.

The invention claimed is:
1. A vehicle comprising:
a rechargeable power storage device;
a power line that transmits electric power to and from the power storage device;
a switching device interposed in the power line and configured to allow electrical connection and disconnection of the power storage device;

a control device that is configured to determine, when transmission of the electric power to or from the power storage device ends, whether the switching device is welded or not, and that is configured not to determine, when the transmission of the electric power to or from the power storage device starts, whether the switching device is welded or not;
a charging unit that receives electric power supplied from the external power supply through a cable connected to the connection unit for charging the power storage device; and
a discharging unit that supplies electric power from the power storage device to the cable through the connection unit, wherein
the switching device includes:
a first switching unit interposed in a first power line connecting the discharging unit and the connection unit; and
second switching unit interposed in a second power line connecting the power storage device and the charging unit,
the vehicle is configured to be capable of switching between a charging operation of charging the power storage device with electric power from an external power supply, and a discharging operation of supplying electric power from the power storage device to an external load; and
when the charging operation or the discharging operation ends, the control device outputs an opening instruction to the switching device, and determines whether the switching device is welded or not based on a state of the power line during output of the opening instruction.

2. The vehicle according to claim 1, further comprising:
a connection unit that is configured to electrically connect the vehicle,
wherein when the discharging operation ends, the control device outputs the opening instruction to the first switching unit, and determines whether the first switching unit is welded or not based on a state of the first power line during output of the opening instruction.

3. The vehicle according to claim 2, wherein when the charging operation ends, the control device outputs the opening instruction to the second switching unit, and determines whether the second switching unit is welded or not based on a state of the second power line during output of the opening instruction.

4. A power supply system including a vehicle and a charging stand that transmits electric power between the vehicle and an external power supply or an external load, wherein
the charging stand is configured to allow transmission of electric power from the external power supply to the vehicle through a cable connected to a connection unit provided in the vehicle, and transmission of electric power from the vehicle to the external load through the cable, and
the vehicle includes
a rechargeable power storage device,
a power line that transmits electric power to and from the power storage device;
a switching device interposed in the power line and configured to allow electrical connection and disconnection of the power storage device;
a control device that is configured to determine, when transmission of the electric power to or from the power storage device ends, whether the switching device is welded or not, and that is configured not to determine, when the transmission of the electric power to or from the power storage device starts, whether the switching device is welded or not;
a charging unit that receives electric power supplied from the external power supply through the cable for charging the power storage device; and
a discharging unit that supplies electric power from the power storage device to the cable through the connection unit, wherein
the switching device includes:
a first switching unit interposed in a first power line connecting the discharging unit and the connection unit; and
a second switching unit interposed in a second power line connecting the power storage device and the charging unit,
when ending a discharging operation of supplying electric power from the power storage device to the external load, the control device outputs an opening instruction to the first switching unit, and determines whether the first switching unit is welded or not based on a state of the first power line during output of the opening instruction; and
when starting the discharging operation, the control device outputs a closing instruction to the first switching unit, and does not determine whether the first switching unit is welded or not.

5. The power supply system according to claim 4, wherein when ending a charging operation of charging the power storage device with electric power from the external power supply, the control device outputs the opening instruction to the second switching unit, and determines whether the second switching unit is welded or not based on a state of the second power line during output of the opening instruction; and
when starting the charging operation, the control device outputs the closing instruction to the second switching unit, and does not determine whether the second switching unit is welded or not.

6. The power supply system according to claim 5, wherein
the charging stand is configured to allow power line communication with the vehicle using the cable; and
the charging stand determines whether the first switching unit is welded or not based on a state of the cable during output of the opening instruction to the first switching unit, and transmits a determination result to the control device.

7. A charging stand for transmitting electric power between a vehicle and an outside of the vehicle, wherein
the vehicle includes:
a rechargeable power storage device,
a power line that transmits electric power to and from the power storage device;
a switching device interposed in the power line and configured to allow electrical connection and disconnection of the power storage device;
a control device that is configured to determine, when transmission of the electric power to or from the power storage device ends, whether the switching device is welded or not, and that is configured not to determine, when the transmission of the electric power to or from the power storage device starts, whether the switching device is welded or not;
a charging unit that receives electric power supplied from the external power supply through the cable for charging the power storage device; and a discharging unit that supplies electric power from the power storage device to the cable through the connection unit; and the switching device includes:
- a first switching unit interposed in a first power line connecting the discharging unit and the connection unit; and
- a second switching unit interposed in a second power line connecting the power storage device and the charging unit, wherein the vehicle is configured to be capable of switching between a charging operation of charging the power storage device with electric power from an external power supply and a discharging operation of supplying electric power from the power storage device to an external load;

when ending the charging operation or the discharging operation, the control device outputs an opening instruction to the switching device, and determines whether the switching device is welded or not based on a state of the power line during output of the opening instruction; and the charging stand is configured to allow transmission of electric power from the external power supply to the vehicle through a cable connected to a connection unit provided in the vehicle, and transmission of electric power from the vehicle to the external load through the cable, and comprises a notification unit for notifying the result of determination of the control device about welding of the switching device.

8. The charging stand according to claim 7, wherein
when ending the discharging operation, the control device outputs the opening instruction to the first switching unit, and determines whether the first switching unit is welded or not based on a state of the first power line during output of the opening instruction.

9. The charging stand according to claim 8, wherein when ending the charging operation, the control device outputs the opening instruction to the second switching unit, and determines whether the second switching unit is welded or not based on a state of the second power line during output of the opening instruction.

10. The charging stand according to claim 7, wherein
the charging stand is configured to allow communication with the control device and receives the result of determination about welding of the switching device from the control device.

11. A control method of a vehicle configured to allow transmission of electric power between a rechargeable power storage device and an external power supply or an external load, the method comprising the steps of:

outputting an opening instruction to a switching device interposed in a power line for transmitting electric power between the power storage device and the external power supply or the external load, when ending transmission of electric power between said power storage device and the external power supply or external load, and determining whether the switching device is welded or not based on a state of the power line during output of the opening instruction; and outputting a closing instruction to the switching device, when starting transmission of electric power between the power storage device and the external power supply or the external load, and not determining during output of the closing instruction whether the switching device is welded or not, wherein the vehicle is configured to be capable of switching between a charging operation of charging the power storage device with electric power from the external power supply and a discharging operation of supplying electric power from the power storage device to the external load;

the vehicle includes:
- a charging unit that receives electric power supplied from the external power supply through a cable connected to the connection unit for charging the power storage device; and
- a discharging unit that supplies electric power from the power storage device to the cable through the connection unit, wherein the switching device includes:
- a first switching unit interposed in a first power line connecting the discharging unit and the connection unit; and
- a second switching unit interposed in a second power line connecting the power storage device and the charging unit, when ending the charging operation or the discharging operation, the steps of outputting an opening instruction to the switching device and determining whether the switching device is welded or not is based on a state of the power line during output of the opening instruction.

* * * * *